(12) United States Patent
Wismar

(10) Patent No.: US 8,737,646 B2
(45) Date of Patent: May 27, 2014

(54) TEMPERATURE COMPENSATED VOLTAGE PUMP

(75) Inventor: Ulrik Wismar, Kalundborg (DK)

(73) Assignee: Invensense, Inc., San Jose, CA (US)

( * ) Notice: Subject to any disclaimer, the term of this patent is extended or adjusted under 35 U.S.C. 154(b) by 465 days.

(21) Appl. No.: 13/058,749

(22) PCT Filed: Jul. 30, 2009

(86) PCT No.: PCT/EP2009/059870
§ 371 (c)(1),
(2), (4) Date: May 4, 2011

(87) PCT Pub. No.: WO2010/018068
PCT Pub. Date: Feb. 18, 2010

(65) Prior Publication Data
US 2011/0200212 A1    Aug. 18, 2011

Related U.S. Application Data

(60) Provisional application No. 61/088,510, filed on Aug. 13, 2008.

(51) Int. Cl.
*H04R 3/00* (2006.01)
*H01L 35/00* (2006.01)

(52) U.S. Cl.
USPC ........... 381/113; 381/111; 381/174; 327/513; 327/536

(58) Field of Classification Search
None
See application file for complete search history.

(56) References Cited

U.S. PATENT DOCUMENTS

| 6,002,599 | A | 12/1999 | Chow |
| 6,188,590 | B1 | 2/2001 | Chang et al. |
| 6,278,315 | B1 | 8/2001 | Kim |
| 6,529,421 | B1 | 3/2003 | Marr et al. |
| 7,750,722 | B2 * | 7/2010 | Kawashima ................. 327/536 |
| 8,259,963 | B2 * | 9/2012 | Stenberg et al. ............. 381/113 |
| 2004/0017247 | A1 | 1/2004 | Yasui et al. |
| 2004/0066225 | A1 | 4/2004 | Seo |

FOREIGN PATENT DOCUMENTS

| EP | 0 834 981 | 4/1998 |
| EP | 1 176 603 | 1/2002 |
| WO | WO 2005/055405 | 6/2005 |
| WO | WO 2006/070324 | 7/2006 |

OTHER PUBLICATIONS

European Patent Office, International Search Report for International application No. PCT/EP2009/059870, Oct. 7, 2009.
European Patent Office, International Preliminary Report on Patentability for International application No. PCT/EP2009/059870, Jan. 4, 2011.

* cited by examiner

*Primary Examiner* — Davetta W Goins
*Assistant Examiner* — James Mooney
(74) *Attorney, Agent, or Firm* — Maryam Imam; IPxLAW Group LLP

(57) ABSTRACT

The present invention relates to an integrated circuit voltage pump with temperature compensation circuitry providing improved DC output voltage accuracy over an operational temperature range. The compensation circuitry is operative to eliminate or reduce temperature induced changes of voltage drops across semiconductor diodes of the integrated circuit voltage pump.

17 Claims, 3 Drawing Sheets

TEMPERATURE COMPENSATED VOLTAGE PUMP

CROSS-REFERENCE TO RELATED APPLICATIONS

This application is a 35 U.S.C. §371 National Phase of International Application No. PCT/EP2009/059870 filed on Jul. 30, 2009, which claims priority to U.S. Provisional Application No. 61/088,510 filed on Aug. 13, 2008, both of which are herein incorporated by reference in their entireties.

The present invention relates to an integrated circuit voltage pump with temperature compensation circuitry providing improved DC output voltage accuracy over an operational temperature range. The compensation circuitry is operative to eliminate or reduce temperature induced changes to voltage drops across semiconductor diodes of the integrated circuit voltage pump.

BACKGROUND OF THE INVENTION

Integrated circuit voltage pumps or charge pumps are used in a diverse range of applications where it is required to provide a DC voltage that is numerically larger than any useful or accessible positive or negative DC voltage in a particular application. Many of these applications are related to portable and battery operated equipment such as mobile terminals or electronic or electroacoustical components therefore. One important area of application for voltage pumps is the supply of DC bias voltage to condenser microphones such as miniature microelectromechanical condenser microphones for telecommunication equipment. In this type of microphone application, an integrated circuit voltage pump is often integrated with other types of signal processing and conditioning circuitry such as preamplifiers, I/O interfaces, voltage regulators, A/D converters etc on a common semiconductor die.

The condenser microphone comprises a transducer element comprising a displaceable diaphragm adjacently positioned to a perforated back plate. The distance between the diaphragm and back-plate is often referred to as an airgap height. In operation, a DC bias voltage is applied between the diaphragm and back-plate by an extremely high impedance DC voltage source. The diaphragm and back-plate form plates of a capacitor structure with an intermediary electrical field generated by the DC bias voltage. Due to the extremely high impedance of the DC voltage source, electrical charge on the capacitor structure is essentially kept constant during operation and sound pressure can be detected by amplification of an induced AC or signal voltage that is essentially proportional with sound pressure impinging on the diaphragm.

The condenser microphone may comprise a microelectromechanical (MEMS) transducer element or a conventional condenser transducer element. MEMS based microphones are often fabricated in batched oriented processes by the application semiconductor processing technologies.

It is generally desirable to make the DC output voltage of an integrated circuit voltage pump as accurate as possible over semiconductor processes variations, supply voltage variations and across an operational or target temperature range such as between 0 and 70 degree Celsius.

This is also true for voltage pumps for condenser microphones because an electroacoustical sensitivity of a condenser microphone is directly related to a level of the applied DC bias voltage. However, telecom condenser microphones with integrated circuit voltage pumps are sold in high volumes and at very low prices. As the cost of an integrated circuit is essentially directly related to the area of the semiconductor die, it is important, for the purpose of reducing price, to minimize die area occupied by the voltage pump.

WO 2005/055405 discloses an exemplary prior art integrated circuit voltage pump based on a Dickson converter. The Dickson converter comprises a plurality of cascaded pump stages wherein each pump stage comprises two cascaded semiconductor diodes or diodes with a first pump capacitor disposed in-between the diodes and a second capacitor electrically connected to the cathode of the second diode. Each of the diodes is brought into and out of its forward or conducting mode in an alternating manner by a pair of non-overlapping voltage pulses supplied to the first and second pump capacitors, respectively. Since each diode is connected in series with its respective pump capacitor, variations in the voltage drop across a diode, for example caused by temperature changes or semiconductor process variations, in conducting mode lead to a corresponding change of the pump capacitor voltage. This change of the pump capacitor voltage will be reflected throughout a cascade of pump stages to the DC output voltage of the integrated circuit voltage pump. A diode voltage drop across a diode such as a diode-connected PMOS transistor has a temperature coefficient of about 2 mV per degree C. so that a 40 degrees change of operating temperature leads to a change in diode voltage drop of about 80 mV. This temperature effect is obviously multiplied with the number of individual pump stages and leads to an undesirable and possibly large change of the DC output voltage of the integrated circuit voltage pump across a nominal or desired temperature range.

This and other problems are solved in accordance with the present invention wherein the integrated circuit voltage pump comprises temperature compensation circuitry that eliminates or reduces the effect of the above-described temperature induced changes of the diode voltage drops in conducting mode.

PRIOR ART

EP 1176603 A1 discloses a charge-pump circuit for supplying voltage to cells of a semiconductor memory. The output voltage of the charge-pump is compensated for temperature variations and design and manufacturing variations by a feedback loop.

U.S. Pat. No. 6,529,421 discloses a charge-pump circuit coupled to a NMOS pull-down transistor in a SRAM memory cell. The charge pump circuit functions a body bias generator ("back-bias") for the pull-down transistor and is responsive to temperature changes to compensate for temperature-induced variations of threshold voltage of the NMOS pull-down transistor.

US 2004/0066225 discloses a dual-charge pump circuit coupled to a feed-back type of regulation circuit. The regulation circuit compares the output voltage of the dual-charge pump with a reference voltage and supplies first and second clock signals of varying clock period to the dual-charge pump circuit to keep its output voltage constant

SUMMARY OF INVENTION

According to a first aspect of the invention, there is provided an integrated circuit voltage pump comprising an input terminal adapted to receive a DC input voltage and an output terminal supplying a DC output voltage derived from the DC input voltage. A pump stage is disposed in-between the input terminal and the output terminal and comprises first and second semiconductor diodes electrically connected to first and second pump capacitors, respectively. Each of first and second semiconductor diodes has a diode voltage drop with a predetermined temperature coefficient in conducting mode. A compensation circuit is adapted to generate first and second non-overlapping voltages pulses of respective amplitudes based on first and second non-overlapping clock signals and apply the first and second voltage pulses to the first and second pump capacitors, respectively. The compensation circuit is adapted to adjust the amplitude of at least one of the first and second non-overlapping voltage pulses to compensate for temperature induced changes in at least one of the diode voltage drops.

The present integrated circuit voltage pump or voltage pump preferably comprises a Dickson pump architecture wherein the first and second semiconductor diodes in an alternating manner are brought into and out of conducting mode controlled by the first and second non-overlapping voltage pulses. The first and second non-overlapping voltage pulses are applied to the first and second pump capacitors, respectively, on opposite capacitor nodes to the nodes electrically connected to the semiconductor diodes. The first and second pump capacitors function as respective electrical charge storage devices.

The compensation circuit is preferably adapted to adjust the respective amplitudes of the first and second non-overlapping voltage pulses to compensate for respective temperature induced changes of diode voltage drops of the first and second semiconductor diodes. According to one embodiment of the invention, the amplitude of first voltage pulse may be adjusted independently of the amplitude of the second voltage pulse. This may be advantageous if the temperature coefficient of the first semiconductor diode is different from the temperature coefficient of the second semiconductor diode—for example if the semiconductor diodes are of different types. However, in embodiments where the first and second semiconductor diodes are of the same type with substantially identical temperature coefficients, the amplitudes of the first and second voltage pulses may advantageously be adjusted by the same amount.

The first and second semiconductor diodes preferably comprise a diode selected from the group of: poly-diode, diffusion diode in a N-well, diode-connected MOS transistor, diode-connected bipolar transistor. The first and second semiconductor diodes are preferably of the same type for example diode-connected PMOS transistors, but may be of different type in certain invention embodiments, in particular in embodiments where the semiconductor diodes posses reasonably matched temperature coefficients in conducting mode or forward biased mode despite a difference of type. The pump capacitors may comprise respective metal capacitors, respective poly-poly capacitors or MOS (Metal-Oxide-Silicon) capacitors or any other appropriate type or types of capacitor devices available on the particular integrated circuit technology in question.

The integrated circuit voltage pump may comprise a plurality of cascaded pump stages wherein each pump stage comprises respective semiconductor diodes electrically connected to respective pump capacitors. The number of pump stages is usually adapted to a desired or target DC output voltage in view of the amplitude of the first and second voltage pulses. All semiconductor diodes of the plurality of cascaded pump stages are preferably of same type and may additionally have identical dimensions to simplify circuit layout on an integrated semiconductor substrate. By adjusting the number of cascaded pump stages a broad range of DC output voltages can be obtained in a straight-forward manner.

In some embodiments, the number of cascaded pump stages may be chosen to provide a DC output voltage of the voltage pump that numerically between 2 and 10 times larger than the DC input voltage. For example, if the DC input voltage is 1.8 Volt, the DC output voltage range lies between 3.6 and 18 Volt and if the DC input voltage is −1.8 Volt, the DC output voltage range lies between −3.6 and −18 Volt.

According to a particularly advantageous embodiment of the invention, the compensation circuit is configured to derive the respective predetermined amplitudes of first and second non-overlapping voltages pulses from a temperature sensitive DC voltage source. The temperature sensitive DC voltage source has a temperature coefficient substantially identical to the temperature coefficient of the first and/or the second semiconductor diode which makes it well-suited for deriving various types of AC or DC voltages which follow or track temperature variations of the diode voltage drops across the first and second semiconductor diodes. In one variant of this embodiment, the forward biased semiconductor diode is connected in-between the temperature sensitive DC voltage source and a substantially temperature independent DC voltage source. The substantially temperature independent DC voltage source may comprise a bandgap voltage reference or generator or any other type of suitable temperature independent DC voltage source such as a DC voltage source with a temperature coefficient below 0.2 mVolt/° C., or more preferably below 0.1 mVolt/° C.

The temperature sensitive DC voltage source preferably comprises a forward biased semiconductor diode of same type as at least one of the first and second semiconductor diodes to allow an output DC voltage to track changes of the diode voltage drops across the first and second semiconductor diodes.

A stationary level of current through the forward biased semiconductor diode may furthermore advantageously be set substantially identical to a stationary level of current through the first and/or second semiconductor diodes to allow a temperature coefficient of the voltage drop across the forward biased semiconductor diode to further improve tracking between the diode voltage drops across the first and/or second semiconductor diodes and a DC voltage of the temperature sensitive DC voltage source. The stationary level of current is in the present context an average current through each of the semiconductor diode after the DC output voltage of the voltage pump has reached its stationary value.

In a number of useful embodiments of the invention, the forward biased semiconductor diode is biased in a weak-inversion region where the stationary level of current through first and second semiconductor diodes of the pump stage is relatively small such as between 1 and 100 μA or between 5 and 10 μA. The stationary level of current through semiconductor diodes of a pump stage is often small in applications where the load impedance on the integrated circuit voltage pump is very large. A large load impedance is often presented by a capacitive electroacoustical transducer element coupled to the DC output voltage of the voltage pump. In miniature condenser microphone applications, an impedance of an electroacoustical transducer element often corresponds to a capacitance between 0.5 and 10 pF.

Alternatively, the forward biased semiconductor diode may be biased in a medium-inversion region or strong inversion region, in particular, but not exclusively, in applications where the load impedance on the voltage pump is small and the stationary current through each of the first and second semiconductor diodes correspondingly large.

In one advantageous embodiment of the invention, the level of stationary current through the forward biased semiconductor diode is adaptively adjusted to the level of current through one or both of the first and second semiconductor diodes. This has the advantage that the voltage pump can handle a large range of load impedances and still deliver a DC output voltage with a low temperature variation because close matching between the stationary level current through first and/or second semiconductor diodes of the pump stage and the stationary level of current through the forward biased semiconductor diode is maintained. According to this embodiment the compensation circuit comprises:

a current sensor adapted to detect a level of current through the first or the second semiconductor diode, an adaptive control loop adapted to adjust a level of current through the forward biased semiconductor diode of the temperature sensitive DC voltage source to match the detected level of current through the first or the second semiconductor diode.

In one embodiment of the invention, the compensation circuit comprises a clock pump circuit which utilizes the above-mentioned temperature sensitive DC voltage source and the temperature independent DC voltage source to generate the first and second non-overlapping voltages pulses with appropriate temperature dependence from the first and second non-overlapping clock signals. According to this embodiment, the compensation circuit comprises a first stage coupled to the first and second non-overlapping clock signals and supplied with power from the temperature independent DC voltage source. A second stage is operatively connected to signal outputs of the first stage and supplied with power from the temperature sensitive DC voltage source to generate the first and second non-overlapping voltages pulses. The first stage may comprise first and second inverters with respective inputs coupled to the first and second non-overlapping clock signals and outputs coupled to respective inputs of the second stage.

The voltage pump may comprise an integrally formed clock generator adapted to generate the first and second non-overlapping clock signals. Alternatively, the clock generator may be placed externally to the voltage pump and appropriate non-overlapping clock signal applied to the voltage pump through appropriate clock input terminals or pads.

Another aspect of the invention relates to a condenser microphone which comprises a microphone transducer element. The microphone transducer element preferably comprises a displaceable diaphragm and an adjacently positioned perforated back plate. An integrated circuit voltage pump according to any of the above-described embodiments is operatively connected to the microphone transducer element and configured to apply a DC bias voltage between the displaceable diaphragm the perforated back plate. The DC bias voltage may have a magnitude between 4 and 10 Volt for condenser microphones that are based on a microelectromechanical (MEMS) transducer element or a magnitude between 10 and 60 Volts for a conventional condenser transducer element.

BRIEF DESCRIPTION OF THE DRAWINGS

A preferred embodiment of the invention will be described in more detail in connection with the append drawings in which.

DESCRIPTION OF A PREFERRED EMBODIMENT

Figure 1:
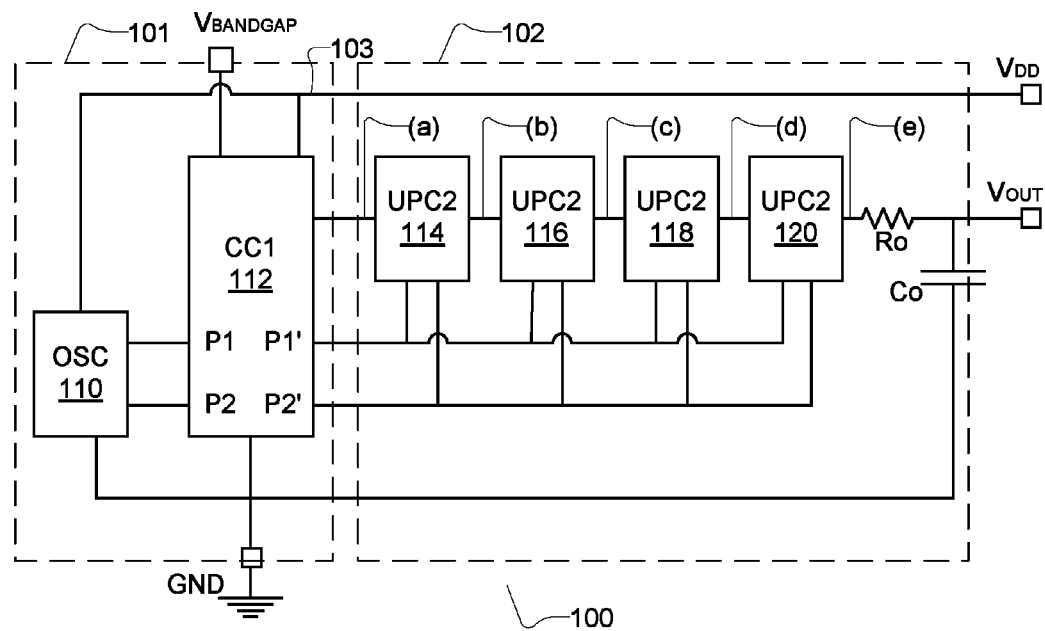
FIG. 1 is a schematic drawing of an integrated circuit voltage pump in accordance with a first embodiment of the invention.

FIG. 1 shows an integrated circuit voltage pump or voltage pump 100 according to a preferred embodiment of the invention. The voltage pump 100 is based on a so-called Dickson pump architecture that comprises four cascaded pump stages 114, 116, 118, 120. The Dickson charge pump architecture is characterized by a simple circuit configuration which can be implemented in many different integrated circuit semiconductor processes or technologies, for example CMOS or BiC-MOS sub-micron processes, and with very small die area occupation. The present voltage pump is preferably fabricated in standard semiconductor processes which often possess some level of support of high-voltage tolerant components. Alternatively, a high-voltage semiconductor process may be utilized for implementation of the present voltage pump 100 for example by exploiting a selected sub-set of high voltage integrated circuit components that can withstand higher voltages than a nominal supply voltage. The Dickson pump architecture enables the use of such subset of high voltage components e.g. deep N-Wells.

Another advantage of Dickson-based charge pumps is their low noise and low output ripple in the DC output voltage when driving high impedance loads (for example capacitor plates formed by the diaphragm and backplate structure of a condenser microphone transducer). That is, when the DC output voltage of the voltage pump 100 has reached a nominal DC voltage, the current through rectifying diodes D1, D2, D3 and D4 embodied as diode-connected PMOS transistors (refer to FIG. 2) becomes very small. This leads to a dramatically increased impedance of the diodes D1, D2, D3 and D4 and thus effectively filters any switching noise and noise from other circuit parts.

In FIG. 1, a first circuit portion 101 comprises a non-overlapping clock generator (OSC) 110 operatively connected to a compensation circuit (CC1) 112. A second circuit portion 102 comprises the four cascaded pump stages 114, 116, 118, 120 disposed in-between an input terminal, (a), and an output terminal, $V_{OUT}$, of the voltage pump 100 providing a DC voltage output. An optional low pass/smoothing filter, comprising series resistance Ro and smoothing capacitor Co, is connected in-between pump output node (e) and the $V_{OUT}$ terminal This low pass/smoothing filter is operative to attenuate noise components such as switching related noise in the DC output voltage at $V_{OUT}$. The series resistance Ro may comprise a resistor, a diode or even a pair of anti-parallel diodes or any combination thereof. Since a resistor with large resistance, which is required for good noise component attenuation, tend to occupy a large surface area on an integrated semiconductor die or substrate, it may be advantageous to implement the series resistance Ro as a diode or network of diodes. This is particularly the case if the load current drawn through the output terminal, $V_{OUT}$, is very small for example less than 1 nA or less than 1 pA.

DC supply voltage to the voltage pump is supplied through DC supply terminal $V_{DD}$. This $V_{DD}$ terminal may be connected to a suitable DC power supply line or rail of am integrated circuit which comprises the present voltage pump 100 or it may be electrically connected to an external power rail of a portable communication device. In some embodiments of the invention, a voltage regulator is inserted in-between the depicted $V_{DD}$ terminal and the DC supply line 103 of the voltage pump 100 to provide a stable DC supply voltage to the voltage pump 100 independent of possible voltage variations or fluctuations on the DC supply terminal $V_{DD}$.

In addition, an accurate and substantially temperature independent DC voltage is provided to the compensation circuit 112 from a bandgap voltage generator (not shown) through terminal $V_{BANDGAP}$.

The non-overlapping clock generator 110 generates and supplies a set of non-overlapping clock or oscillator signals to the compensation circuit 112 through circuit nodes or terminals P1 and P2. The present voltage pump 100 is particularly well-suited as a building block on an integrated circuit for telecommunication condenser microphones. The DC output voltage, on terminal $V_{OUT}$, of the present voltage pump 100 is preferably adapted to lie in the range between 5 and 20 volts. In other embodiments of the present voltage pump, a DC output voltage up to about 60 volts can be provided even though this latter voltage may require a tailored high voltage IC process.

A clock frequency of the non-overlapping clock signals is preferably within the range of 100 kHz-10 MHz in the present application, but other embodiments may require higher or lower clock frequencies depending on the requirements of the specific application.

The compensation circuit 112 comprises a clock pump circuit which is adapted to raise or increase the amplitude of the first and second non-overlapping clock signals, supplied on terminals P1 and P2, and generate first and second corresponding non-overlapping voltage pulses of respective amplitudes. This is explained in detail in connection with FIG. 4. The non-overlapping voltage pulses are provided through terminals P1' and P2', respectively, and applied to each of the cascaded pumps stages 114, 116, 118, 120. Each of the preferably substantially identical pump stages, designated UPC2, is provided with an input signal which at circuit nodes (b), (c) and (d) is characterized as a DC voltage superimposed by an oscillating signal with a pulse amplitude largely corresponding to the pulse amplitude of P1' or P2'.

The node (a) is preferably coupled to receive a DC input voltage from the compensation circuit CC1 (112). This DC input voltage is about 1.0 Volt in the present embodiment of the invention, but can vary according to the number of pump stages, characteristics of the pump stages and the desired/target DC output voltage of the voltage pump 100. The DC input voltage is preferably constituted by, or derived from, a highly temperature-independent and process independent DC voltage source to maintain accuracy of the pumped or multiplied DC output voltage that is derived from the DC input voltage. In the present embodiment of the invention, the DC input voltage is derived from an on-chip bandgap voltage reference external to the voltage pump 100 as explained in connection with FIG. 3.

The cascade of pumps stages 114, 116, 118, 120 generates increasingly larger voltage levels starting from circuit node (a) to circuit node (b), to circuit node (c), to (d) and to (e).

Figure 2:
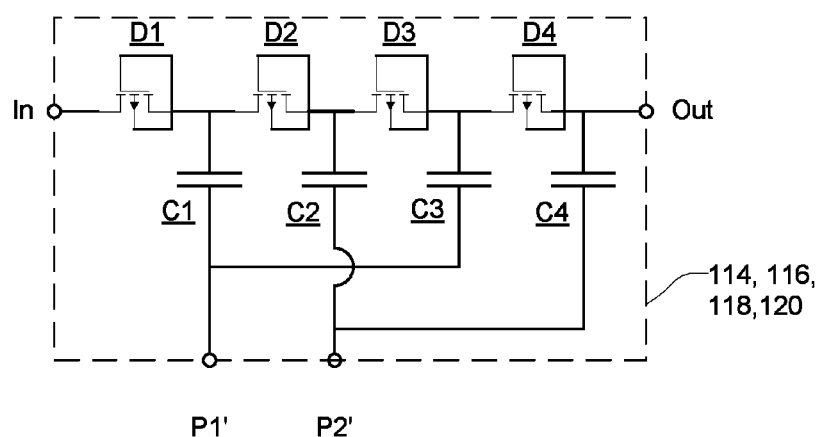
FIG. 2 is a schematic drawing of a diode-based voltage pump stage of the integrated circuit voltage pump depicted in FIG. 1.

As illustrated by FIG. 2, the present embodiment of the invention uses four separate diode-capacitor couplings or assemblies for each pump stage 114, 116, 118, 120, but fewer or more couplings can be utilized such as two diode-capacitor couplings in a pump stage. Likewise, additional or fewer diode-capacitor couplings may be used in other embodiments of the voltage pump depending on the available DC input voltage, the amplitude of the first and second voltage pulses P1' and P2', and/or the desired/target DC output voltage. A Dickson voltage pump usually comprises several diode-capacitor couplings such between 5 and 20.

As illustrated by FIG. 2, the input signal to a pump stage is provided to a first diode-connected PMOS transistor, D1, or PMOS diode at the terminal designated 'In' and a pumped output signal is provided at a terminal designated 'Out'. The pump stage comprises four pump capacitors, C1-C4, that each have a first terminal connected to an internal circuit node disposed in-between a pair of cascaded PMOS diodes. The other or second terminal of the pump capacitor is operatively connected to one of the terminals P1' and P2' which applies the first and second non-overlapping voltage pulses. The pump stage operates by letting the first and second non-overlapping voltage pulses on P1' and P2' alternately charge the capacitors C1, C3 and C2, C4, respectively. In the clock phase where P1' is inactive or logic "0", for example on ground level, pump capacitor C1 is electrically charged through PMOS diode D1 that is forward biased (conducting mode) while PMOS diode D2 is reverse biased (non-conducting mode) because the voltage pulse on P2' is active or logic "1" at the predetermined amplitude. In the opposite clock phase, P1' is active while on P2' is inactive which means that internal node between PMOS diode D1 and D2 is raised to a voltage that corresponds to the "In" voltage added to the amplitude of pulse voltage P1' minus a forward diode voltage drop across D1 in its conducting mode. By proper choice of the amplitudes of voltage pulses P1' and P2', all internal nodes of the pump stage can accordingly be gradually raised to a voltage level above the voltage level on "In".

However, accuracy of the DC output voltage on $V_{OUT}$ of the voltage pump 100 is directly related to both the amplitudes of the first and second non-overlapping voltage pulses on P1' and P2' and to the diode voltage drop across each of the cascaded PMOS diodes, such as D1 and D2, in its conductive mode. Since a Dickson type of voltage pump often comprises a substantial number of cascaded diodes, for example 16 PMOS diodes evenly distributed between four identical pump stages in the present embodiment of the invention, any change of a diode voltage drop will lead to a multiplied effect in the DC output voltage and cause undesired variations from its nominal or intended value.

Since the diode voltage drop across a PMOS diode in its conductive mode or state has a temperature dependence of about 2 mV per degree Celsius, a change in operating temperature of the present voltage pump 100 from 0 to 70 degree Celsius will lead to a substantial temperature-induced change of the DC output voltage of approximately 16*140 mV=2.24 Volt if the voltage pump is left uncompensated (assuming that all diodes are of the same type and operated on identical temperature). Other types of semiconductor diodes exhibit corresponding temperature dependences.

It is worthwhile to notice that the diode voltage drop, and its associated temperature dependence, is set by the fundamental semiconductor physics of the specific type of diode and as such largely independent of the size, geometry and process outcome of the diode.

Figure 3:
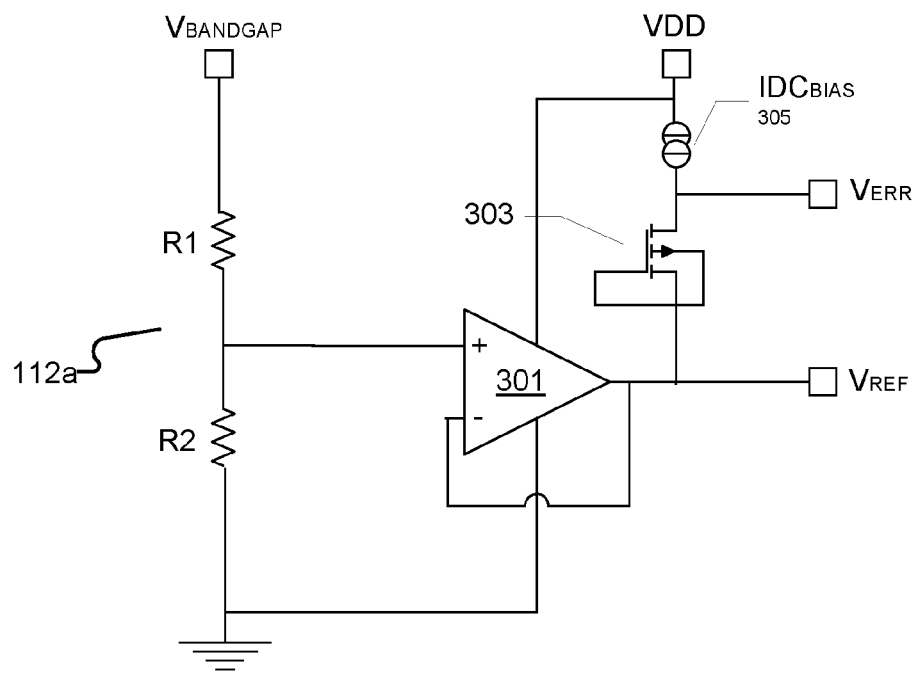
FIG. 3 is a schematic drawing of a first portion of a compensation circuit for the integrated circuit voltage pump depicted in FIG. 1.
Figure 4:
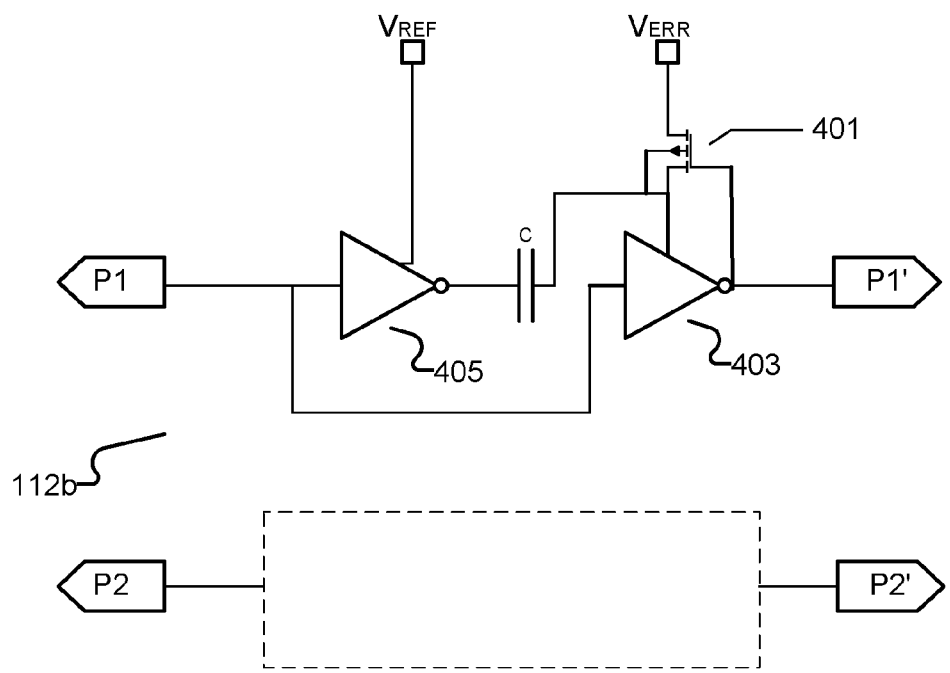
FIG. 4 is a schematic drawing of a clock pump circuit included in a second portion the compensation circuit for the integrated circuit voltage pump depicted in FIG. 1.

FIG. 3 and FIG. 4 show respective portions 112a, 112b of the compensation circuit CC1 (112) adapted to compensate for the above-mentioned temperature induced changes of PMOS diode voltage drops in the present voltage pump 100. The operation of the compensation circuit 112 improves the accuracy of the DC output voltage of the present voltage pump 100 across its operating temperature range.

FIG. 3 shows a first portion 112a of the compensation circuit 112 and includes a resistive voltage divider comprising resistors R1 and R2 coupled to a high-accuracy DC bandgap voltage through the terminal $V_{BANDGAP}$ from the on-chip bandgap voltage reference as explained above. A unity-gain coupled non-inverting operational amplifier 301 provides a buffered and scaled replica of the DC bandgap voltage from the resistive voltage divider as a substantially temperature independent DC voltage on terminal $V_{REF}$. A temperature sensitive DC voltage is generated on terminal $V_{ERR}$ and this DC voltage is one PMOS diode voltage drop above the DC reference voltage because the diode-connected PMOS transistor 303 is biased in its forward or conducting mode by constant current generator $IDC_{BIAS}$ 305. The DC current of $IDC_{BIAS}$ is preferably adjusted to a value between 1-100 µA such as between 5-10 µA to keep PMOS transistor 303 biased in the weak-inversion region when it has dimensions of about 200/0.35 µm (W/L). This range of values for $IDC_{BIAS}$ gives a good match to the stationary current in each of the cascaded PMOS diodes, D1-D4 in the present embodiment of the invention and therefore ensures that temperature characteristics of the diode-connected PMOS transistor 303 closely matches those of the cascaded PMOS diodes D1-D4 each of the pump stages (on FIG. 2) in conducting or forward biased mode.

Furthermore, because the diode-coupled PMOS transistor 303 of the compensation circuit 112 is of the same type as the rectifying PMOS diodes D1-D4 of each of the pump stages 114, 116, 118, 120 (FIGS. 2 & 3) any temperature induced change of a diode voltage drop in the rectifying PMOS diodes D1-D4 in conductive mode is tracked by a proportional change of a diode voltage drop across the diode-coupled PMOS transistor 303. Furthermore, even semiconductor process induced changes to diode voltage drops in the rectifying PMOS diodes D1-D4 are tracked by the diode-coupled PMOS transistor 303 in this case. This means that the temperature sensitive DC voltage on terminal $V_{ERR}$ is subjected to the same temperature induced DC voltage change as each of the rectifying PMOS diodes D1-D4 because the DC voltage on terminal $V_{REF}$ is substantially temperature independent as explained in detail above. This tracking between the temperature sensitive DC voltage on terminal $V_{ERR}$ and the respective diode voltage drops across the rectifying PMOS diodes D1-D4 is exploited by the portion of the compensation circuit 112 (CC1 on FIG. 1) illustrated in FIG. 4.

FIG. 4 shows a clock pump circuit 112b that comprises two substantially identical portions for generating the first and second non-overlapping voltage pulses P1' and P2' as indicated by the dashed box. The clock pump circuit 112b is adapted to increase the respective amplitudes or levels of the first and second non-overlapping clock signals provided on input terminals P1 and P2, respectively, by the non-overlapping clock generator 110 (see FIG. 1). The output signals of the clock pump circuit 112b are the above-described first and second non-overlapping voltage pulses P1' and P2' supplied to the pump stages 114, 116, 118, 120 (refer to FIGS. 2 & 3).

The clock pump circuit 112a comprises a first stage in form of inverter 405 (and a corresponding inverter inside replica circuit in the dotted box) that is supplied with power from the DC reference voltage on terminal $V_{REF}$. This means the clock signal out of the inverter 405 has an amplitude substantially identical to the DC reference voltage. However, the second stage comprises a second inverter 403 coupled to the temperature sensitive DC voltage generated on terminal $V_{ERR}$ through PMOS transistor 401. Since this second inverter 403 is operatively connected to the first stage and supplied with power from the temperature sensitive DC voltage on terminal $V_{ERR}$, the amplitude of the first non-overlapping voltage pulse P1' is set by superposition of the temperature sensitive DC voltage (on terminal $V_{ERR}$) and the DC reference voltage level of the clock signal at output of the first stage inverter 405. Consequently, the amplitude of the first non-overlapping voltage pulse P1' (and the amplitude of the second non-overlapping voltage pulse P2') comprises a contribution from the temperature sensitive DC voltage which tracks temperature variations, and semiconductor process variations, as of the diode-coupled PMOS transistor 303 in the first portion of the compensation circuit 112a. This means that temperature induced or semiconductor process induced changes of the conducting mode diode voltage drops across the rectifying PMOS diodes D1-D4 are tracked by a corresponding change in amplitude of voltage pulses P1' and P2'. The adjustment of the amplitude of voltage pulses P1' and P2' accordingly compensates for voltage changes on internal nodes in each pump stage caused by changes of the voltage drops across PMOS diodes D1-D4 because the respective voltages at these internal nodes are set by the respective amplitudes of the non-overlapping voltage pulses P1' and P2'.

In the present embodiment of the invention, all pump stages 114, 116, 118, 120 of the voltage pump 100 (refer to FIGS. 2 & 3) are substantially identical. The amplitudes of voltage pulses P1' and P2' are equal and track each other across temperature since both voltage pulses are derived from the temperature sensitive DC voltage generated on terminal $V_{ERR}$. Furthermore, because the same voltage pulses P1' and P2' are applied to all (substantially identical) pump stages 114, 116, 118, 120 all pump stages can be compensated simultaneously by a single and low-complexity circuit as shown in FIGS. 3 and 4. Another highly advantageous property of the present embodiment of the invention is that the number of individual pump stages is scalable without requiring any modification of the compensation circuit 112. This feature allows the DC output voltage of the pump circuit 100 to be adapted to requirements of any specific application in a reliable and fast manner.

The low complexity and low die area occupation of the compensation circuit 112 is also highly advantageous in many cost-sensitive high-volume applications because it keeps the cost of the voltage pump 100 low.

Figure 5:
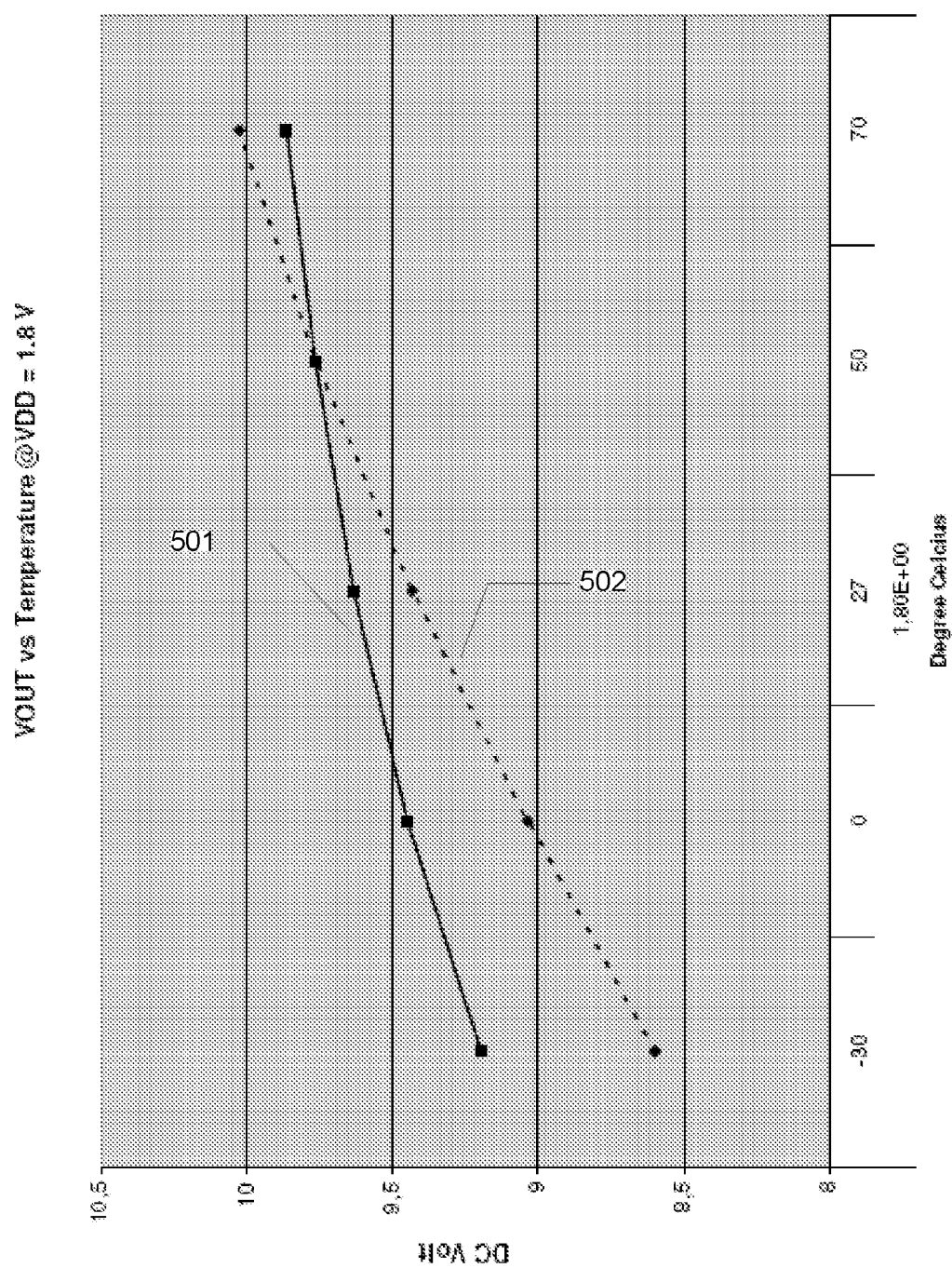
FIG. 5 is a plot of DC output voltage versus temperature for an experimental integrated circuit voltage pump according a second embodiment of the invention.

FIG. 5 shows a plot of DC output voltage versus temperature for an experimental integrated circuit voltage pump in accordance with the invention in comparison with a corresponding voltage pump without the inventive temperature compensation circuit. The tested experimental voltage pump embodiment was overall identical to the voltage pump 100 depicted on FIGS. 1-4 in circuit topology, but included seven separate diode-capacitor couplings or assemblies as opposed to the above-illustrated embodiment with 16 separate diode-capacitor couplings. The tested experimental integrated circuit voltage pump was fabricated in 0.35 µm CMOS semiconductor process (including deep n-wells) and a pair of diodes was used to implement the resistance Ro of the low pass/smoothing filter prior to the DC output voltage at terminal $V_{OUT}$ (component Ro of FIG. 1).

The DC input voltage to the experimental integrated circuit voltage pump was set to 1.8 Volt for the measurement results depicted on the graph. In the graph, the measured DC output voltage at terminal $V_{OUT}$ of the voltage pump 100 is plotted along the y-axis while the temperature of the voltage pump in degrees Celsius is plotted along the x-axis. As illustrated, the test temperature was swept from about minus 30 degrees to plus 70 degrees.

The full line 501 of the graph shows the measured DC output voltage at terminal $V_{OUT}$ versus temperature for the experimental voltage pump (i.e. embodying the invention) while the dotted line 502 shows the measured DC output voltage of the voltage pump without the temperature compensation circuit. It will be appreciated that a substantial reduction of the variation of the DC output voltage over temperature has been obtained. The variation is around 2.5 Volt for the uncompensated voltage pump and only around 0.7 Volt for the experimental voltage pump. Furthermore, supplemental investigations of the experimental voltage pump indicated that a large portion of the measured residual DC output voltage variation over temperature was attributable to the above-described pair of series diodes used to implement the resistance Ro of the low pass/smoothing filter (Refer to FIG. 1). Accordingly, further performance improvements of the experimental voltage pump are readily available by replacing the pair of series diodes with resistors or other resistive components with smaller temperature coefficients but similar resistance value.

The invention claimed is:

1. An integrated circuit voltage pump comprising:
an input terminal adapted to receive a DC input voltage;
an output terminal supplying a DC output voltage derived from the DC input voltage;
a pump stage disposed in-between the input terminal and the output terminal and comprising first and second semiconductor diodes electrically connected to first and second pump capacitors, respectively, each of first and second semiconductor diodes having a diode voltage drop with a predetermined temperature coefficient in conducting mode;
a compensation circuit adapted to generate first and second non-overlapping voltages pulses of respective amplitudes based on first and second non-overlapping clock signals and apply the first and second voltage pulses to the first and second pump capacitors, respectively,
the compensation circuit being adapted to adjust an amplitude of at least one of the first and second non-overlapping voltage pulses to compensate for temperature induced changes in at least one of the diode voltage drops,
the compensation circuit configured to derive the respective amplitudes of first and second non-overlapping voltage pulses from a temperature sensitive DC voltage source having a temperature coefficient substantially identical to the temperature coefficient of the first or the second semiconductor diode;
wherein the temperature sensitive DC voltage source comprises a forward biased diode of the same type as at least one of the first and second semiconductor diodes which is connected in-between a terminal of the temperature sensitive voltage source and a substantially temperature independent DC voltage source; and
wherein the compensation circuit is supplied with power from the terminal of the temperature sensitive voltage source.

2. An integrated circuit voltage pump according to claim 1, wherein the compensation circuit is adapted to adjust the respective amplitudes of the first and second non-overlapping voltage pulses to compensate for respective temperature induced changes of the first and second diode voltage drops.

3. An integrated circuit voltage pump according to claim 1, comprising plurality of cascaded pump stages disposed in-between the input terminal and the output terminal.

4. An integrated circuit voltage pump according to claim 1, wherein each semiconductor diode comprises a diode selected from a group including a poly-diode, a diffusion diode in a N-well, a diode-connected MOS transistor, and a diode-connected bipolar transistor.

5. An integrated circuit voltage pump according to claim 1, wherein all semiconductor diodes of the pump stage, or all semiconductor diodes of the plurality of cascaded pump stages, are of same type.

6. An integrated circuit voltage pump according to claim 1, wherein the compensation circuit comprises a clock pump circuit comprising:
a first stage coupled to the first and second non-overlapping clock signals and supplied with power from the temperature independent DC voltage source; and
a second stage operatively connected to signal outputs of the first stage and supplied with power from the temperature sensitive DC voltage to generate the first and second non-overlapping voltages pulses.

7. An integrated circuit voltage pump according to claim 1, wherein the compensation circuit comprises:
a current sensor adapted to detect a level of current through the first or the second semiconductor diode; and
an adaptive control loop adapted to adjust a level of current through the forward biased semiconductor diode of the temperature sensitive DC voltage source to match the detected level of current through the first or the second semiconductor diode.

8. An integrated circuit voltage pump according to claim 1, wherein the first and second pump capacitors comprise respective metal capacitors, poly-poly capacitors or MOS capacitors.

9. A condenser microphone circuit comprising:
a microphone transducer element comprising a displaceable diaphragm and an adjacently positioned perforated back plate; and
an integrated circuit voltage pump operatively connected to the microphone transducer element and configured to apply a DC bias voltage between the displaceable diaphragm the perforated back plate, wherein the integrated circuit voltage pump includes:
an input terminal adapted to receive a DC input voltage;
an output terminal supplying a DC output voltage derived from the DC input voltage;
a pump stage disposed in-between the input terminal and the output terminal and comprising first and second semiconductor diodes electrically connected to first and second pump capacitors, respectively, each of first and second semiconductor diodes having a diode voltage drop with a predetermined temperature coefficient in conducting mode;
a compensation circuit adapted to generate first and second non-overlapping voltages pulses of respective amplitudes based on first and second non-overlapping clock signals and apply the first and second voltage pulses to the first and second pump capacitors, respectively,
the compensation circuit being adapted to adjust an amplitude of at least one of the first and second non-overlapping voltage pulses to compensate for temperature induced changes in at least one of the diode voltage drops,
the compensation circuit configured to derive the respective amplitudes of first and second non-overlapping voltage pulses from a temperature sensitive DC voltage source having a temperature coefficient substantially identical to the temperature coefficient of the first or the second semiconductor diode;
wherein the temperature sensitive DC voltage source comprises a forward biased diode of the same type as at least one of the first and second semiconductor diodes which is connected in-between a terminal of the temperature sensitive voltage source and a substantially temperature independent DC voltage source; and wherein the compensation circuit is supplied with power from the terminal of the temperature sensitive voltage source.

10. A condenser microphone circuit according to claim 9, wherein the compensation circuit is adapted to adjust the respective amplitudes of the first and second non-overlapping voltage pulses to compensate for respective temperature induced changes of the first and second diode voltage drops.

11. A condenser microphone circuit according to claim 9, further comprising plurality of cascaded pump stages disposed in-between the input terminal and the output terminal.

12. A condenser microphone circuit according to claim 9, wherein each semiconductor diode comprises a diode selected from a group including a poly-diode, a diffusion diode in an N-well, a diode-connected MOS transistor, and a diode-connected bipolar transistor.

13. A condenser microphone circuit according to claim 9, wherein all semiconductor diodes of the pump stage, or all semiconductor diodes of the plurality of cascaded pump stages, are of same type.

14. A condenser microphone circuit according to claim 9, wherein the compensation circuit comprises a clock pump circuit comprising:
 a first stage coupled to the first and second non-overlapping clock signals and supplied with power from the temperature independent DC voltage source; and
 a second stage operatively connected to signal outputs of the first stage and supplied with power from the temperature sensitive DC voltage to generate the first and second non-overlapping voltages pulses.

15. A condenser microphone circuit according to claim 9, wherein the compensation circuit comprises:
 a current sensor adapted to detect a level of current through the first or the second semiconductor diode; and
 an adaptive control loop adapted to adjust a level of current through the forward biased semiconductor diode of the temperature sensitive DC voltage source to match the detected level of current through the first or the second semiconductor diode.

16. A condenser microphone circuit according to claim 9, wherein the first and second pump capacitors comprise respective metal capacitors, poly-poly capacitors or MOS capacitors.

17. A voltage pump circuit, comprising:
 an input terminal to receive a DC input voltage;
 an output terminal to supply a DC output voltage derived from the DC input voltage;
 a pump stage connected between the input and output terminals, the pump stage including first and second diodes connected to first and second pump capacitors, each of the first and second diodes having a forward-biased diode voltage drop with a temperature coefficient; and
 a compensation circuit to generate first and second non-overlapping voltage pulses as a function of first and second non-overlapping clock signals, apply the first and second voltage pulses to the first and second pump capacitors, and adjust an amplitude of at least one of the first or second non-overlapping voltage pulses as a function of a temperature sensitive DC voltage to compensate for temperature induced changes in the diode voltage drop of at least one of the first or second diodes,
 wherein the compensation circuit includes a temperature sensitive DC voltage source including a third diode connected to a substantially temperature independent DC voltage source, the third diode having a forward-biased diode voltage drop with a temperature coefficient substantially the same as the temperature coefficient of the forward-biased diode voltage drop of the first or the second diodes.

* * * * *